(12) United States Patent
Sewell et al.

(10) Patent No.: US 10,396,235 B2
(45) Date of Patent: Aug. 27, 2019

(54) INDENTATION APPROACHES FOR FOIL-BASED METALLIZATION OF SOLAR CELLS

(71) Applicant: SUNPOWER CORPORATION, San Jose, CA (US)

(72) Inventors: Richard Hamilton Sewell, Los Altos, CA (US); Nils-Peter Harder, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 339 days.

(21) Appl. No.: 14/885,820

(22) Filed: Oct. 16, 2015

(65) Prior Publication Data

US 2017/0110619 A1    Apr. 20, 2017

(51) Int. Cl.
*H01L 31/18* (2006.01)
*H01L 31/0224* (2006.01)
*H01L 31/0236* (2006.01)
*H01L 31/0745* (2012.01)

(52) U.S. Cl.
CPC ........ *H01L 31/18* (2013.01); *H01L 31/02363* (2013.01); *H01L 31/02366* (2013.01); *H01L 31/022433* (2013.01); *H01L 31/022441* (2013.01); *H01L 31/0745* (2013.01); *H01L 31/1876* (2013.01); *Y02E 10/50* (2013.01)

(58) Field of Classification Search
None
See application file for complete search history.

(56) References Cited

U.S. PATENT DOCUMENTS

| 4,252,263 A * | 2/1981 | Houston | B23K 20/023 228/193 |
|---|---|---|---|
| 8,003,530 B2 | 8/2011 | Grohe et al. | |
| 8,766,090 B2 | 7/2014 | Sewell et al. | |

(Continued)

FOREIGN PATENT DOCUMENTS

WO    WO-2012135052    10/2012

OTHER PUBLICATIONS

International Search Report and Written Opinion for PCT Patent Application No. PCT/US16/51789 dated Dec. 20, 2016, 17 pgs.

(Continued)

*Primary Examiner* — Shaun M Campbell
(74) *Attorney, Agent, or Firm* — Schwabe, Williamson & Wyatt, P.C.

(57) ABSTRACT

Indentation approaches for foil-based metallization of solar cells, and the resulting solar cells, are described. For example, a method of fabricating a solar cell includes forming a plurality of alternating N-type and P-type semiconductor regions in or above a substrate. The method also includes locating a metal foil above the alternating N-type and P-type semiconductor regions. The method also includes forming a plurality of indentations through only a portion of the metal foil, the plurality of indentations formed at regions corresponding to locations between the alternating N-type and P-type semiconductor regions. The method also includes, subsequent to forming the plurality of indentations, isolating regions of the remaining metal foil corresponding to the alternating N-type and P-type semiconductor regions.

20 Claims, 10 Drawing Sheets

(56) References Cited

U.S. PATENT DOCUMENTS

| | | | |
|---|---|---|---|
| 2007/0290327 A1* | 12/2007 | Nakasato | H01L 21/486 |
| | | | 257/698 |
| 2012/0118369 A1 | 5/2012 | Hedtke et al. | |
| 2013/0000715 A1* | 1/2013 | Moslehi | H01L 31/022441 |
| | | | 136/256 |
| 2014/0090698 A1 | 4/2014 | Kumai et al. | |
| 2014/0174519 A1 | 6/2014 | Rim et al. | |
| 2015/0280021 A1* | 10/2015 | Harley | H01L 31/022441 |
| | | | 136/255 |

OTHER PUBLICATIONS

International Preliminary Report on Patentability from PCT/US2016/051789 dated Apr. 26, 2018, 14 pgs.

* cited by examiner

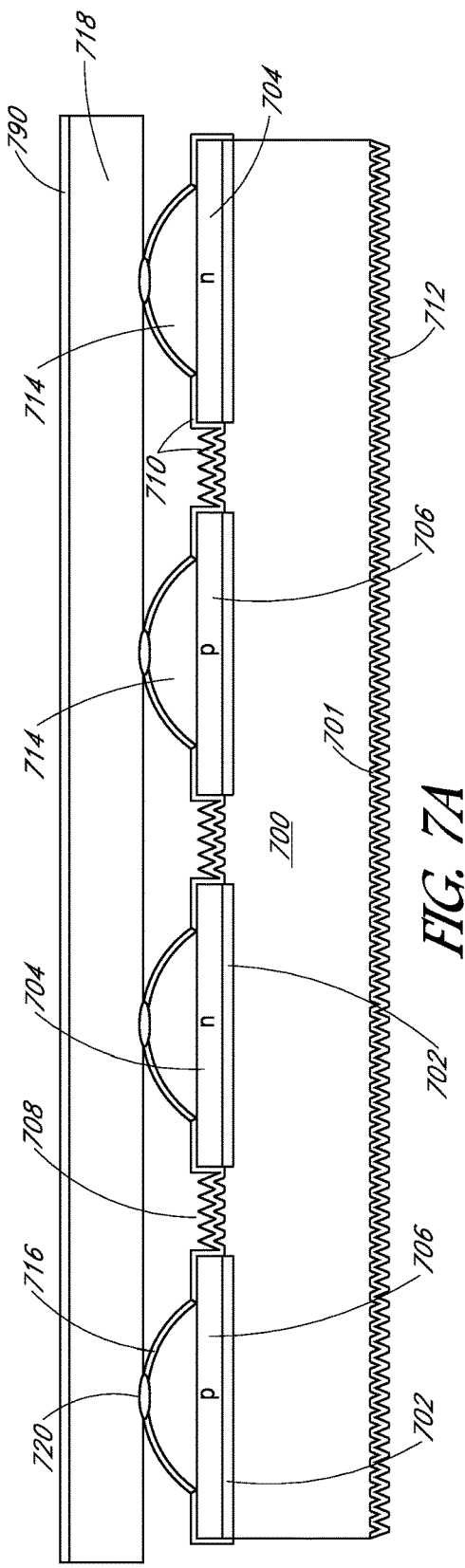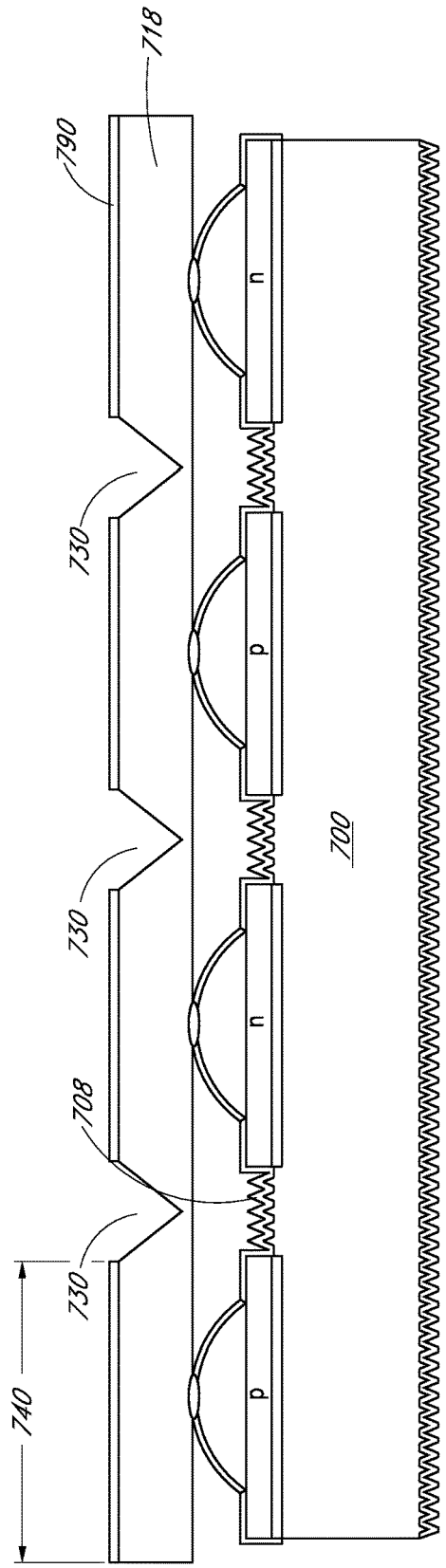

INDENTATION APPROACHES FOR FOIL-BASED METALLIZATION OF SOLAR CELLS

TECHNICAL FIELD

Embodiments of the present disclosure are in the field of renewable energy and, in particular, include indentation approaches for foil-based metallization of solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

BRIEF DESCRIPTION OF THE DRAWINGS

FIGS. 7A-7C illustrate cross-sectional views of various stages in the fabrication of a solar cell using foil-based metallization, in accordance with another embodiment of the present disclosure.

DETAILED DESCRIPTION

Figure 1A:
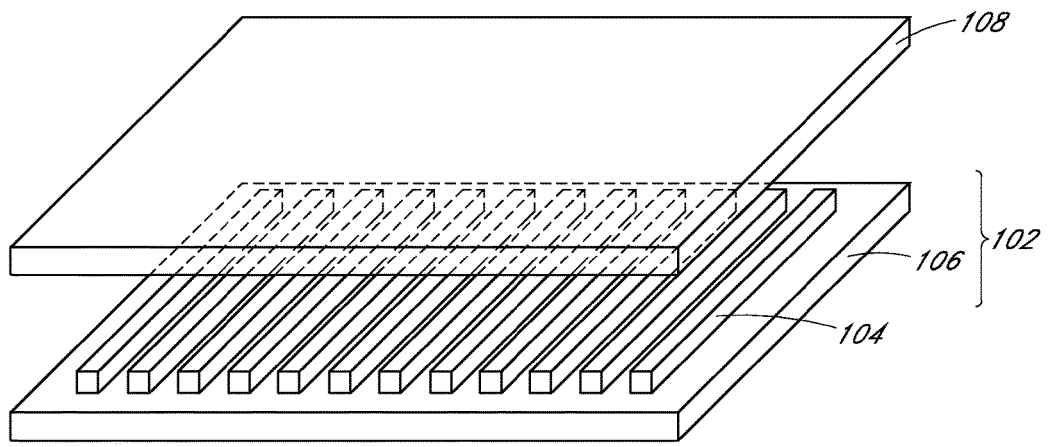
FIGS. 1A-1C illustrate angled views of various stages in the fabrication of a solar cell using foil-based metallization, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Indentation approaches for foil-based metallization of solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a plurality of alternating N-type and P-type semiconductor regions in or above a substrate. The method also includes locating a metal foil above the alternating N-type and P-type semiconductor regions. The method also includes forming a plurality of indentations through only a portion of the metal foil, the plurality of indentations formed at regions corresponding to locations between the alternating N-type and P-type semiconductor regions. The method also includes, subsequent to forming the plurality of indentations, isolating regions of the remaining metal foil corresponding to the alternating N-type and P-type semiconductor regions.

In another embodiment, a method of fabricating a solar cell includes forming a plurality of alternating N-type and P-type semiconductor regions in or above a substrate. The method also includes locating a metal foil above the alternating N-type and P-type semiconductor regions. The method also includes forming a mask layer on the metal foil. The method also includes forming a plurality of indentations through the mask layer and through only a portion of the metal foil, the plurality of indentations formed at regions corresponding to locations between the alternating N-type and P-type semiconductor regions. The method also includes, subsequent to forming the plurality of indentations, isolating regions of the remaining metal foil corresponding to the alternating N-type and P-type semiconductor regions by etching the remaining metal foil at the locations between the alternating N-type and P-type semiconductor regions, wherein the mask layer protects the remaining metal foil corresponding to the alternating N-type and P-type semiconductor regions during the etching.

In another embodiment, a method of fabricating a solar cell includes locating a metal foil above alternating N-type and P-type semiconductor regions formed in or above a substrate. The metal foil has a plurality of indentations formed through only a portion of the metal foil. The method also includes aligning the plurality of indentations with regions corresponding to locations between the alternating N-type and P-type semiconductor regions. The method also includes, subsequent to aligning the plurality of indentations, isolating regions of the remaining metal foil corresponding to the alternating N-type and P-type semiconductor regions.

One or more embodiments described herein provides a technique for patterning a metal foil (such as an aluminum foil) bonded to a solar cell. In an embodiment, a metallization structure for interdigitated back-contact (IBC) solar cell is described. The metallization structure is foil-based and requires structuring into parts that are electrically separated from one another, and which can be accomplished without many processing operations. Some embodiments described below provide a natural combination of the metallization technology based on thermal compression bonding with the fabrication of a structure based on a metal foil, such as an aluminum (Al) foil.

To provide context, metallization of solar cells can invoke a large cost factor in the fabrication of solar cells, either driven by material costs (such as current mainstream silver metal paste printing) or by a large number of processing operations and the associated capital expense. Aluminum lends itself to low material costs, but the structuring techniques may be difficult or cumbersome when depositing full-area Al films such as through physical vapor deposition (PVD; e.g., evaporation, sputtering) films, or/and when using Al foils. Aluminum paste printing and the inherent structuring of the printing is possible in principal, but in practice Al paste printing is not well-suited for contacting n-type material, and the firing process of the Al paste may destroy the n-type and p-type surface doping structures that are implemented in silicon wafers typically by thermal diffusion of dopants.

Other approaches are therefore being investigated, such as the use of Al foils. An Al foil may provide a readily available sheet of metal of relatively high conductivity which may be directly attached to the solar cell. Laser-welding has been investigated for attaching the Al foil to the solar cell, which may feature a first, thin (thus cost-effective) PVD-deposited metallization layer. While challenges still exist for such an approach, a particular challenge is to apply such a technique in a cost effective manner to interdigitated back contact (IBC) solar cells. These solar cells have both types of contacts at the rear of the solar cell, and therefore the metallization layer (the foil) has to be separated (structured) into two parts without galvanic connection.

Next to laser-welding, thermal compression bonding of the Al foil onto a thinly metalized solar cell is also being considered. Thermal compression boding involves the use of only moderate temperatures and pressure (and possibly some shearing force as well) to join the Al foil with a thin Al seed, which may be sputtered onto the solar cell. This approach can be implemented to produce a connection of an unstructured Al foil to the silicon wafer. That is, for use in IBC solar cells, a structuring operation may be needed for the Al foil, and ideally at the same time for the blanket seed layer.

To structure an Al foil, laser ablation is being contemplated, as is a masking plus chemical etching scheme. So far, no process is known that can completely separate the Al foil into two separated contact structure pieces by only using laser ablation and without causing damage to the solar cell. Therefore, additional etching is often required. Similarly, etching is also used in the "mask and etch" approach, which can involve use of a printed etch mask, etching the Al foil in the areas not covered by the mask, and lifting off the mask.

A pure "mask and etch" approach should etch all the way through Al foils that are often thick, e.g., greater than 30 microns. This can be expensive and difficult from a manufacturing point of view. It is to be appreciated that the amount of etching may be reduced by making use of the fact that laser ablation can create a groove in the Al foil prior to etching. However, the laser groove must not penetrate too deep in order to avoid laser damage to the solar cell. Consequently, the laser grooving does only moderately facilitate the separation of the Al foil pieces by etching, yet it requires the use of an additional expensive equipment (i.e., the laser system). Similarly, it may be possible to combine etch masks and laser ablation to make use of the ability to laser-ablate such etch masks in order to structure them, but the resulting process remains complex and requires additional processing steps and equipment.

Addressing one or more of the above issues, in accordance with an embodiment of the present disclosure, a surface-structured piece is used which involves indentation of grooves into an Al foil that is ultimately used for metallization of the solar cell. As the process involves mechanical contact and pressure to the Al foil onto the solar cell, embodiments may provide a natural way to exploit thermal compression bonding of the Al foil onto the solar cell. During the thermal compression bonding, or at least as the very last operation, a surface-structured piece, e.g. a stamp, or a roller with a structured (non-flat) surface topography may be pressed into the Al foil to create grooves, and possibly perforate a protective coating on the Al foil at those locations, where the surface features of the roller, stamp or other tool penetrate rather deeply into the Al foil. Embodiments can be implemented to make use of the deformability of an Al foil at suitable bonding temperatures in order to create structures (e.g., grooves, deep indentations) in the Al foil during the same process that bonds the Al foil onto the wafer.

More specifically, an embodiment involves first deposition of a metal layer, e.g., 100 nanometer thick aluminum, onto a silicon wafer that has undergone a "front-end" of a solar cell process. For example, in particular implementation of an IBC solar cell. Subsequently, an Al foil is positioned on top of the silicon solar cell and thermal compression bonding is executed. Either as part of this thermal compression bonding operation, or as an additional operation at the end of the thermal compression bonding, a tool such as a stamp or a roller is used to indent the Al by pressing surface structures into the Al foil in order to create grooves or perforations at these locations. The process needs to be aligned to the n- and p-type regions that exist within the silicon wafer under the first metal layer. In the regions of the deep indentations, the foil is substantially thinner. Exposing the Al foil to an etching bath therefore provides etching that first clears out the material in the region of the indented grooves, and can provide the possibility for structuring the Al foil. Furthermore, the underlying thin Al seed layer can receive the same etching and, in one embodiment, is therefore structured in the same operation.

In another or additional embodiment, the Al foil first receives a protective coating on the surface that is ultimately structured by the indentations. The protective coating can be implemented to protect or sufficiently slow down the etching of the Al when brought in contact with the etch that is used to clear out the Al in the indented grooves. The protective coating can become disrupted or perforated in the regions of the grooves that are formed by indentation. This may be accomplished by using a brittle material for the coating, or by using a sufficiently thin coating that breaks up easily upon exerting the indentation deformation. If such disruption of a protective coating is accomplished, the etch selectivity between those regions to be etched (grooves) and the remaining Al foil area can be greatly enhanced.

Embodiments of the present disclosure may first involve a fit-up and/or locating of a metal foil with a surface of a solar cell. The metal foil may be pre-sized appropriately for the solar cell or may be first bonded as a larger sheet which is subsequently cut to shape. In an example of a pre-sized foil, FIGS. 1A-1C illustrate angled views of various stages in the fabrication of a solar cell using foil-based metallization, in accordance with an embodiment of the present disclosure.

Figure 1B:
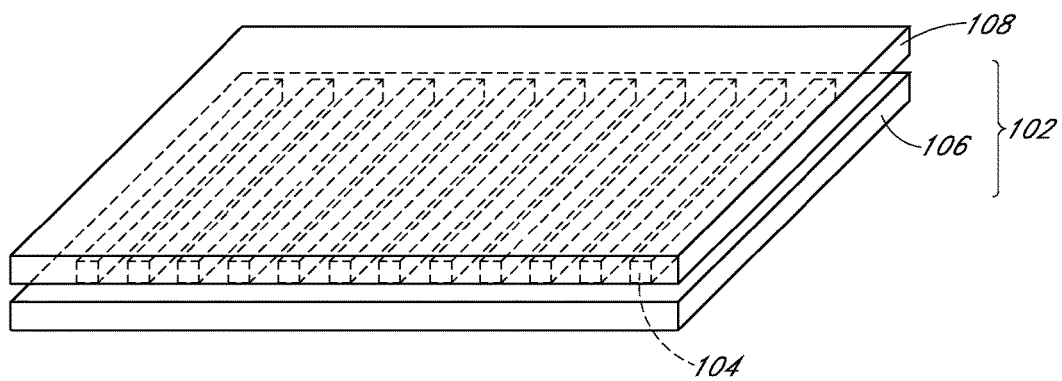

Referring to FIGS. 1A and 1B, a metal foil 108 is placed on a wafer 102 having a plurality of emitter regions 104 (which may include metal seed regions) disposed on or above a substrate 106. In an embodiment, the metallized surface of the wafer 102 includes alternating N-type and P-type semiconductor regions and either a blanket seed layer or a plurality of metal seed material regions on each of the alternating N-type and P-type semiconductor regions, as is described in greater detail below in association with, e.g., FIGS. 5A-5C. In an embodiment, the metal foil 108 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. The metal foil 108 is located or fit-up with the metalized surface of the wafer 102, as shown in FIG. 1B.

Figure 1C:
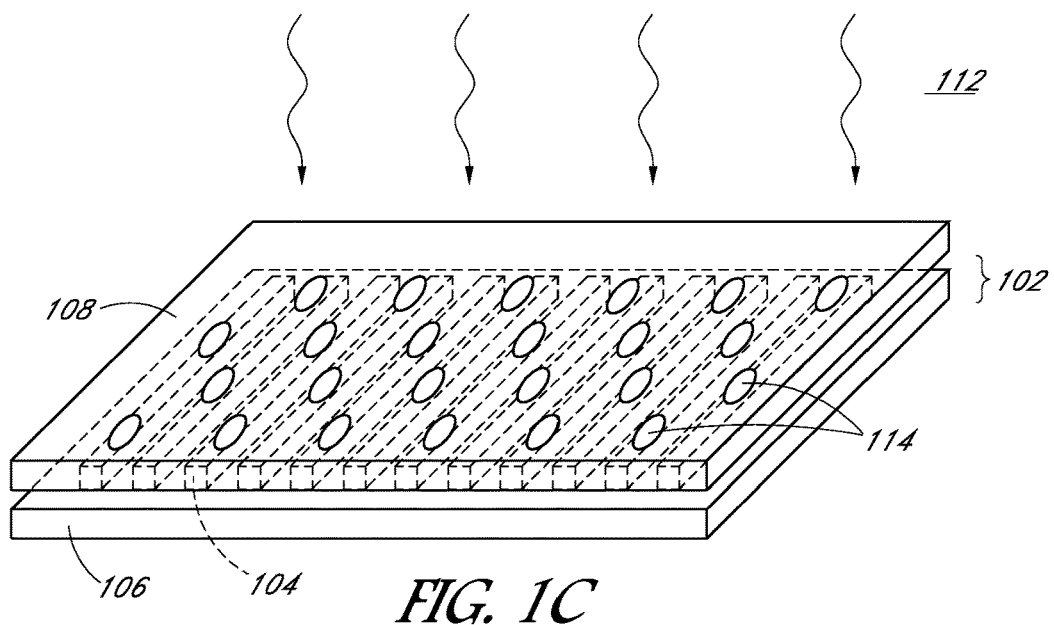

Referring to FIG. 1C, a plurality of spot welds 114 is formed between the metal foil 108 and the metalized surface of the wafer 102. In one embodiment, the spot welds 114 are formed by a laser process 112, as depicted in FIG. 1C. In other embodiments, the spot welds 114 are formed using a tacking process involving thermal compression boding driven by point contact force. In yet other embodiment, a continuous compression bond is formed instead of forming spot welds.

In an embodiment, at the time of joining the metal foil 108 and the substrate 102, the metal foil 108 has a surface area substantially larger than a surface area of the wafer 102 of the solar cell. In one such embodiment, subsequent to electrically contacting the metal foil 108 to the metalized surface of the wafer 102, the metal foil is cut to provide the metal foil 108 having a surface area substantially the same as the surface area of the wafer 102 of the solar cell. In another embodiment, however, prior to placing the metal foil 108 over the metalized surface of the wafer 102 of the solar cell, a large sheet of foil is cut to provide the metal foil 108 having a surface area substantially the same as a surface area of the wafer 102 of the solar cell, as is depicted in FIG. 1A.

In an embodiment, the resulting structure from the process described above in association with FIGS. 1A-1C is subjected to a foil indentation process. For example, FIG. 2 illustrates a plan view of a stage in the fabrication of a solar cell using foil-based metallization, in accordance with an embodiment of the present disclosure.

Figure 2:
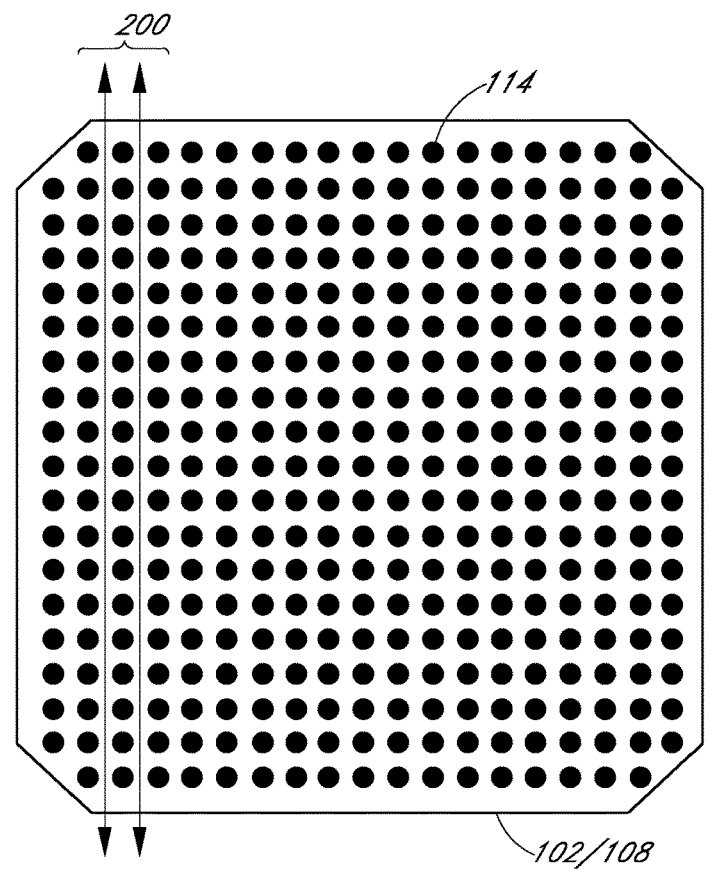
FIG. 2 illustrates a plan view of a stage in the fabrication of a solar cell using foil-based metallization, in accordance with an embodiment of the present disclosure.

Referring to FIG. 2, the structure of FIG. 1C is shown from above with the spot welds 114 seen between cell 102 and foil 108, which are collectively shown as a single layer for transparency. Indentation lines are formed along lines 200 which may extend across the wafer 102, between emitter regions of alternating conductivity type.

A roller may be used to fabricate indentations along direction 200 of FIG. 2. For example, FIG. 3 illustrates a cross-sectional view of a roller having a cylindrical base with a plurality of raised features thereon for fabrication of a solar cell using foil-based metallization, in accordance with an embodiment of the present disclosure.

Figure 3:
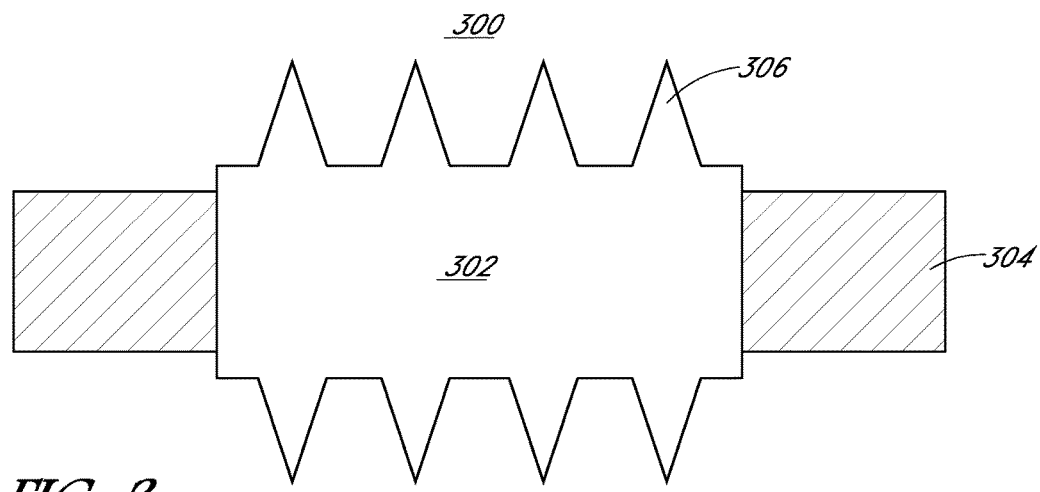
FIG. 3 illustrates a cross-sectional view of a roller having a cylindrical base with a plurality of raised features thereon for fabrication of a solar cell using foil-based metallization, in accordance with an embodiment of the present disclosure.

Referring to FIG. 3, a roller 300 includes a cylindrical base 302 with a plurality of raised features 306 thereon. It is to be appreciated that, in an embodiment, the raised features 306 may circle the entire circumference of the cylindrical base 302 (i.e., into and out of the page) in order to provide a continuous indentation along direction 200 when the roller 300 is rolled along a solar cell. It is also to be appreciated that such a roller 300 may further include handles or grippers 304, as is depicted in FIG. 3.

Figure 4:
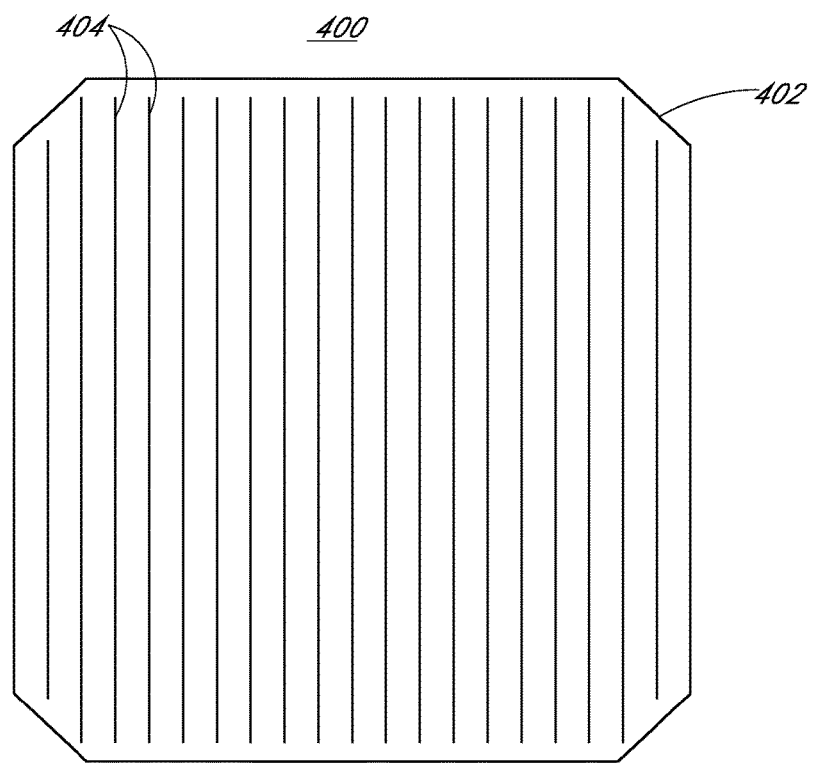
FIG. 4 illustrates a plan view of a die cutter for fabrication of a solar cell using foil-based metallization, in accordance with an embodiment of the present disclosure.

A die cutter may instead be used to fabricate indentations along direction 200 of FIG. 2. For example, FIG. 4 illustrates a plan view of a die cutter for fabrication of a solar cell using foil-based metallization, in accordance with an embodiment of the present disclosure. Referring to FIG. 4, a die cutter 400 includes a frame 402 and includes raised features 404 therein for stamping indentations into a metal foil. In an embodiment, the die cutter 400 is a flat die cutter or a rotary die cutter.

Figure 5A:
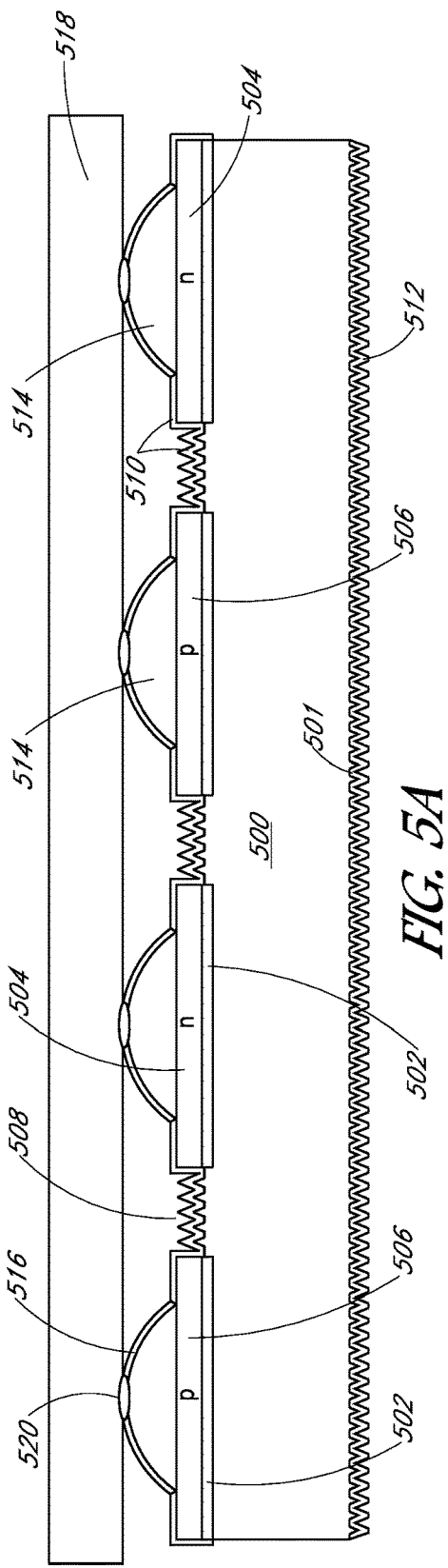
FIGS. 5A-5C illustrate cross-sectional views of various stages in the fabrication of a solar cell using foil-based metallization, in accordance with an embodiment of the present disclosure.
Figure 5B:
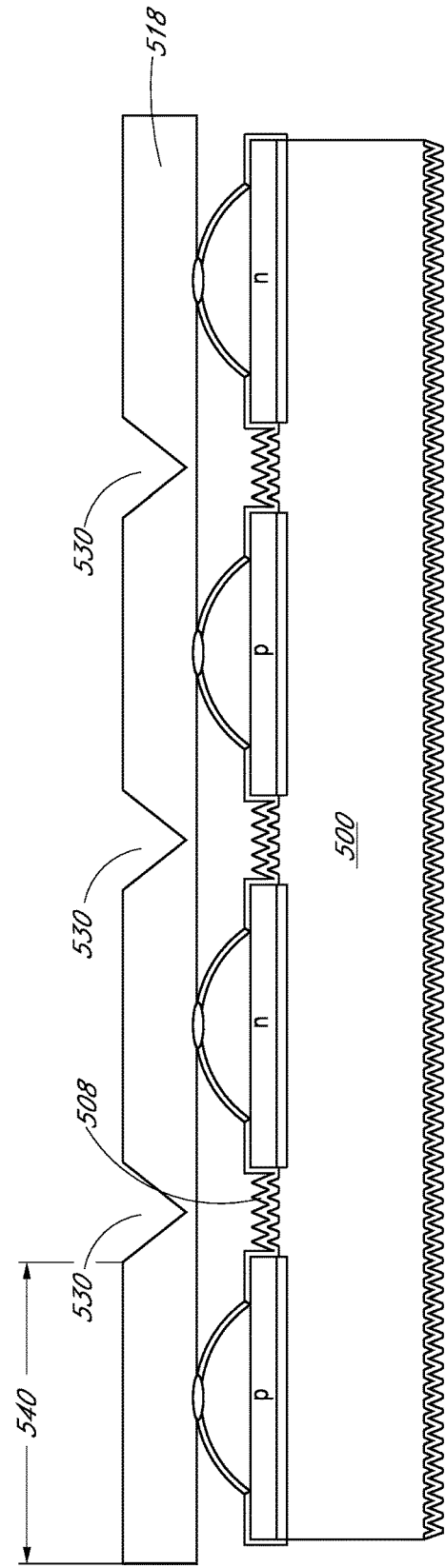
Figure 5C:
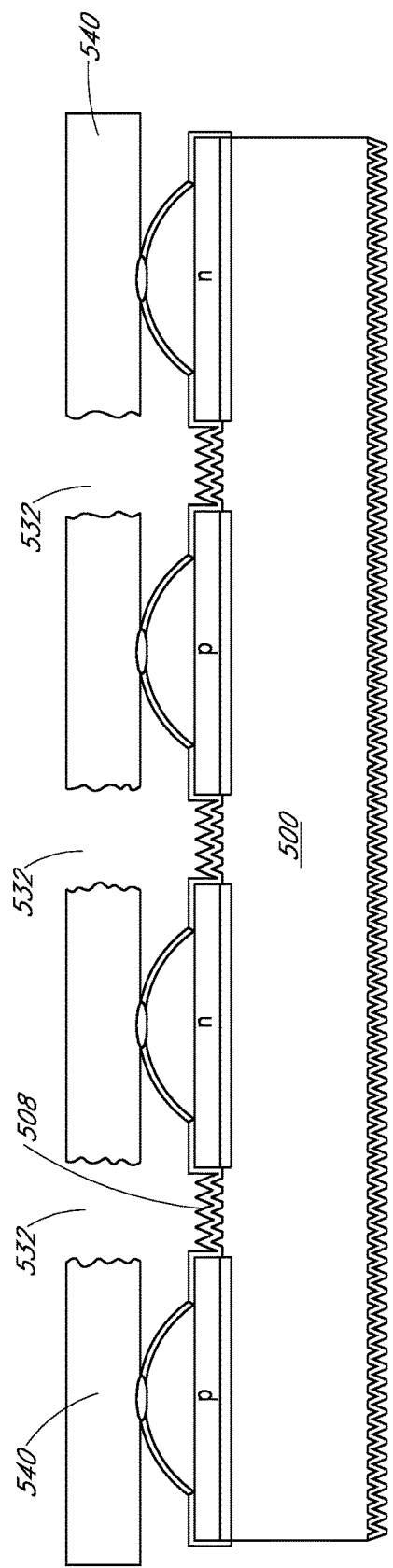
Figure 6:
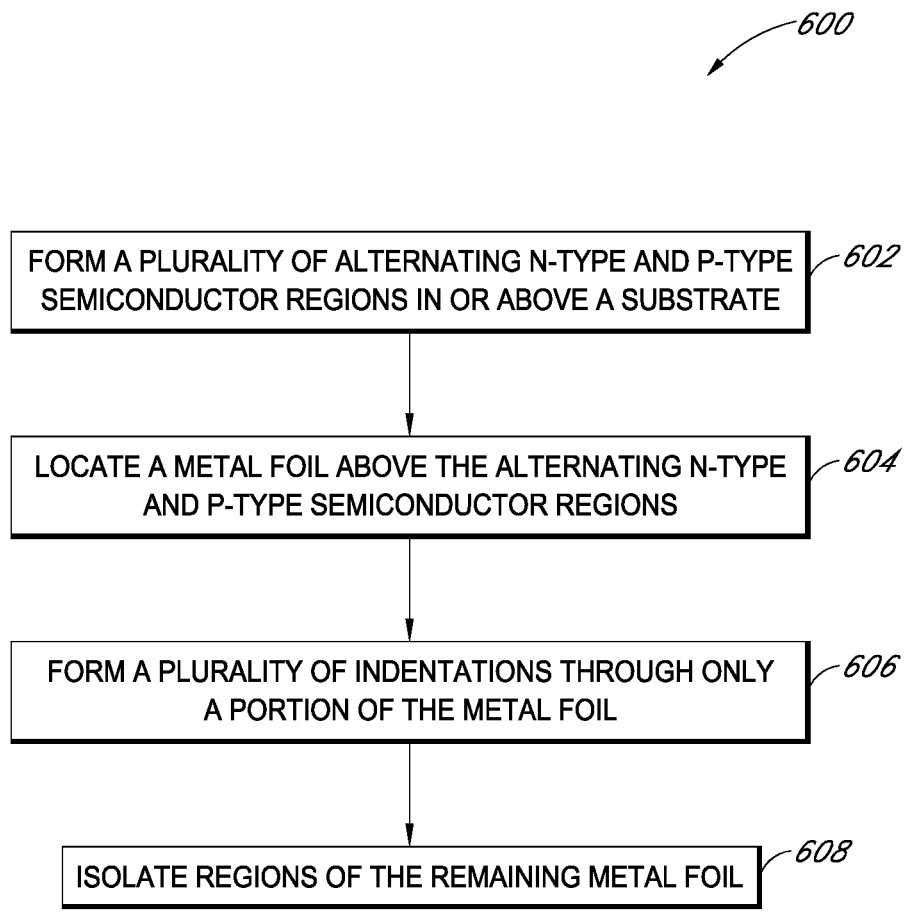
FIG. 6 is a flowchart listing operations in a method of fabricating a solar cell corresponding to FIGS. 5A-5C, in accordance with an embodiment of the present disclosure.

The above described indentation approaches can be implemented to reduce thickness of the metal foil in locations between emitter regions of alternating conductivity type. As an example, FIGS. 5A-5C illustrate cross-sectional views of various stages in the fabrication of a solar cell using foil-based metallization, in accordance with an embodiment of the present disclosure. FIG. 6 is a flowchart listing operations in a method of fabricating a solar cell corresponding to FIGS. 5A-5C, in accordance with an embodiment of the present disclosure.

Referring to operation 602 of flowchart 600 and to corresponding FIG. 5A, a method of fabricating a solar cell includes forming (or otherwise providing) a plurality of alternating N-type and P-type semiconductor regions in or above a substrate. In particular, a substrate 500 has disposed there above N-type semiconductor regions 504 and P-type semiconductor regions 506 disposed on a thin dielectric material 502 as an intervening material between the N-type semiconductor regions 504 or P-type semiconductor regions 506, respectively, and the substrate 500. The substrate 500 has a light-receiving surface 501 opposite a back surface above which the N-type semiconductor regions 504 and P-type semiconductor regions 506 are formed.

In an embodiment, the substrate 500 is a monocrystalline silicon substrate, such as a bulk single crystalline N-type doped silicon substrate. It is to be appreciated, however, that substrate 500 may be a layer, such as a multi-crystalline silicon layer, disposed on a global solar cell substrate. In an embodiment, the thin dielectric layer 502 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 504 and 506, respectively, are formed from polycrystalline silicon formed by, e.g., using a plasma-enhanced chemical vapor deposition (PECVD) process. In one such embodiment, the N-type polycrystalline silicon emitter regions 504 are doped with an N-type impurity, such as phosphorus. The P-type polycrystalline silicon emitter regions 506 are doped with a P-type impurity, such as boron. As is depicted in FIG. 5A, the alternating N-type and P-type semiconductor regions 504 and 506 may have trenches 508 formed there between, the trenches 508 extending partially into the substrate 500. Additionally, in one embodiment, a bottom anti-reflective coating (BARC) material 510 or other protective layer (such as a layer amorphous silicon) is formed on the alternating N-type and P-type semiconductor regions 504 and 506, as is depicted in FIG. 5A.

In an embodiment, the light receiving surface 501 is a texturized light-receiving surface, as is depicted in FIG. 5A. In one embodiment, a hydroxide-based wet etchant is employed to texturize the light receiving surface 501 of the substrate 500 and, possibly, the trench 508 surfaces as is also depicted in FIG. 5A. It is to be appreciated that the timing of the texturizing of the light receiving surface may vary. For example, the texturizing may be performed before or after the formation of the thin dielectric layer 502. In an embodiment, a texturized surface may be one which has a regular or an irregular shaped surface for scattering incoming light, decreasing the amount of light reflected off of the light receiving surface 501 of the solar cell. Referring again to FIG. 5A, additional embodiments can include formation of a passivation and/or anti-reflective coating (ARC) layers (shown collectively as layer 512) on the light-receiving surface 501. It is to be appreciated that the timing of the formation of passivation and/or ARC layers may also vary.

Referring again to FIG. 5A, a plurality of metal seed material regions 514 is formed to provide a metal seed material region on each of the alternating N-type and P-type semiconductor regions 504 and 506, respectively. The metal seed material regions 514 make direct contact to the alternating N-type and P-type semiconductor regions 504 and 506. It is to be appreciated that, although depicted in the Figures as individual seed material regions, a blanket seed layer may instead be formed. In an embodiment, the metal seed regions 514 are aluminum regions. In one such embodiment, the aluminum regions each have a thickness approximately in the range of 0.1 to 20 microns and include aluminum in an amount greater than approximately 97% and silicon in an amount approximately in the range of 0-2%. In other embodiments, the metal seed regions 514 include a metal such as, but not limited to, nickel, silver, cobalt or tungsten. Optionally, a protection layer may be included on the plurality of metal seed material regions 514. In a particular embodiment, an insulating layer 516 is formed on the plurality of metal seed material regions 514. However, other embodiments do not include use of such an insulating layer 516. In an embodiment, the insulating layer 516 is a silicon nitride or silicon oxynitride material layer. In another embodiment, in place of the metal seed regions 514, a blanket metal seed layer is used that is not patterned at this stage of processing. In that embodiment, the blanket metal seed layer may be patterned in a subsequent etching process, such as a hydroxide-based wet etching process.

Referring to operation 604 of flowchart 600 and again to corresponding FIG. 5A, the method of fabricating the solar cell further includes locating a metal foil above the alternating N-type and P-type semiconductor regions. In particular, a metal foil 518 is adhered to the alternating N-type and P-type semiconductor regions 504 and 506. The metal foil 518 may be located or fit-up with the substrate 500 in a manner as described in association with FIGS. 1A-1C. In an embodiment, the metal foil 518 is adhered to the alternating N-type and P-type semiconductor regions 504 and 506 by directly coupling portions of the metal foil 518 with a corresponding portion of each of the metal seed material regions 514. In one such embodiment, the direct coupling of portions of the metal foil 518 with a corresponding portion of each of the metal seed material regions 514 involves forming a metal weld 520 at each of such locations, as is depicted in FIG. 5A. In other embodiments, a continuous thermocompression bond is formed between a continuous seed layer and a continuous foil layer.

In an embodiment, the metal foil 518 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 518 is adhered directly to the plurality of metal seed material regions 514 by using a technique such as, but not limited to, a laser welding process, a thermal compression process and an ultrasonic bonding process. In an embodiment, the optional insulating layer 516 is included, and adhering the metal foil 518 to the plurality of metal seed material regions 514 involves breaking through regions of the insulating layer 516, as is depicted in FIG. 5A.

It is to be appreciated that, in accordance with another embodiment of the present disclosure, a seedless approach may be implemented. In such an approach, metal seed material regions 514 are not formed, and the metal foil 518 is adhered directly to the material of the alternating N-type and P-type semiconductor regions 504 and 506. For example, in one embodiment, the metal foil 518 is adhered directly to alternating N-type and P-type polycrystalline silicon regions. In either case, the process may be described as adhering the metal foil to a metallized surface of a solar cell.

Referring to operation 606 of flowchart 600 and to corresponding FIG. 5B, the method of fabricating the solar cell further includes forming a plurality of indentations through only a portion of the metal foil, the plurality of indentations formed at regions corresponding to locations between the alternating N-type and P-type semiconductor regions. In particular, indentations 530 are formed in the metal foil 518 at regions corresponding to locations between the alternating N-type and P-type semiconductor regions 504 and 506, e.g., above trench 508 locations as is depicted in FIG. 5B. In an embodiment, the indentations 530 are formed through only a portion of the metal foil 518, i.e., extending partially into, but not entirely through, the metal foil 518, as is depicted in FIG. 5B. In an embodiment, the indentations 530 are formed to a depth approximately in the range of 75-90% of an entire thickness of the metal foil 518. Conductive regions 540 are retained between each of the indentations 530.

In an embodiment, forming the plurality of indentations 530 through only the portion of the metal foil 518 involves rolling a roller having a cylindrical base with a plurality of raised features thereon over the metal foil (as described in association with FIGS. 2 and 3), the raised features forming the indentations 530. In one such embodiment, rolling the roller involves thermo-compression bonding the metal foil 518 to the alternating N-type and P-type semiconductor regions using pressure applied from the cylindrical base of the roller. In another embodiment, forming the plurality of indentations 530 through only the portion of the metal foil 518 involves stamping the metal foil 518 with a flat die cutter or a rotary die cutter (as described in association with FIGS. 2 and 4). In an embodiment, the plurality of indentations 530 is formed at a process temperature approximately in the range of 350-550 degrees Celsius.

Referring to operation 608 of flowchart 600 and to corresponding FIG. 5C, the method of fabricating the solar cell further includes, subsequent to forming the plurality of indentations 530, isolating regions 540 of the remaining metal foil corresponding to the alternating N-type and P-type semiconductor regions. That is, the indentations 530 of FIG. 5B are used to isolate conductive regions 540 as metallization structures for the underlying emitter regions. For example, referring to FIG. 5C, the indentations 530 are extended to provide gaps 532 between conductive regions 540. In an embodiment, the patterned metal foil 518 is etched to isolate portions 540 of the metal foil 518. In one such embodiment, the structure of FIG. 5B is exposed to a wet etchant. Although the wet etchant etches all exposed portions of the metal foil 518, a carefully timed etch process is used to break through the bottoms of the indentations 530 without significantly reducing the thickness of the non-indented regions 540 of the metal foil 518, as is depicted in FIG. 5C. In a particular embodiment, a hydroxide based etchant is used, such as, but not limited to, sodium hydroxide, potassium hydroxide (KOH) or tetramethylammonium hydroxide (TMAH).

In another embodiment (not shown), the remaining metal foil 518 of FIG. 5B is subsequently anodized at exposed surfaces thereof to isolate regions 540 of the remaining metal foil 518 corresponding to the alternating N-type and P-type semiconductor regions 504 and 506. In particular, the exposed surfaces of the metal foil 518, including the surfaces of the indentations 530, are anodized to form an oxide coating. At locations corresponding to the alternating N-type and P-type semiconductor regions 504 and 506, e.g., in the indentations 530 at locations above the trenches 508, the entire remaining thickness of the metal foil 518 is anodized there through to isolate regions 540 of metal foil 518 remaining above each of the N-type and P-type semiconductor regions 504 and 506.

Figure 7C:
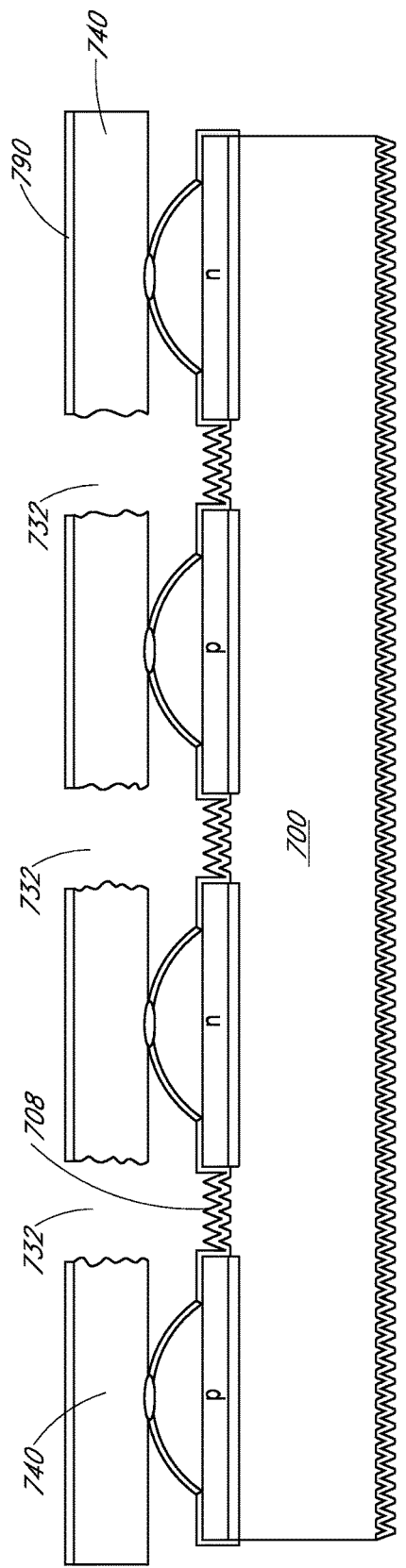
Figure 8:
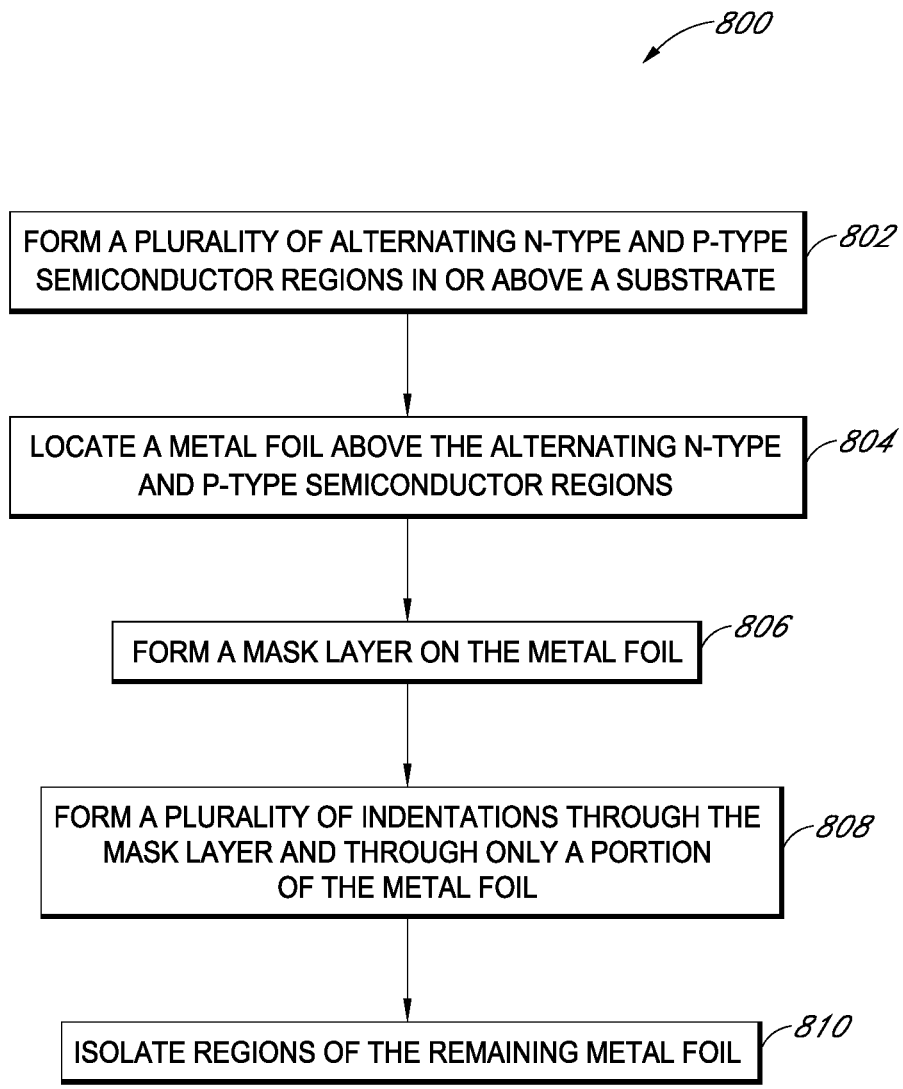
FIG. 8 is a flowchart listing operations in a method of fabricating a solar cell corresponding to FIGS. 7A-7C, in accordance with an embodiment of the present disclosure.

A masking layer may be included in the processing schemes described above. As an example, FIGS. 7A-7C illustrate cross-sectional views of various stages in the fabrication of a solar cell using foil-based metallization, in accordance with another embodiment of the present disclosure. FIG. 8 is a flowchart listing operations in a method of fabricating a solar cell corresponding to FIGS. 7A-7C, in accordance with an embodiment of the present disclosure.

Referring to operation 802 of flowchart 800 and to corresponding FIG. 7A, a method of fabricating a solar cell includes forming (or otherwise providing) a plurality of alternating N-type and P-type semiconductor regions in or above a substrate. In particular, a substrate 700 has disposed there above N-type semiconductor regions 704 and P-type semiconductor regions 706 disposed on a thin dielectric material 702 as an intervening material between the N-type semiconductor regions 704 or P-type semiconductor regions 706, respectively, and the substrate 700. The substrate 700 has a light-receiving surface 701 opposite a back surface above which the N-type semiconductor regions 704 and P-type semiconductor regions 706 are formed.

In an embodiment, the substrate 700 is a monocrystalline silicon substrate, such as a bulk single crystalline N-type doped silicon substrate. It is to be appreciated, however, that substrate 700 may be a layer, such as a multi-crystalline silicon layer, disposed on a global solar cell substrate. In an embodiment, the thin dielectric layer 702 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 704 and 706, respectively, are formed from polycrystalline silicon formed by, e.g., using a plasma-enhanced chemical vapor deposition (PECVD) process. In one such embodiment, the N-type polycrystalline silicon emitter regions 704 are doped with an N-type impurity, such as phosphorus. The P-type polycrystalline silicon emitter regions 706 are doped with a P-type impurity, such as boron. As is depicted in FIG. 7A, the alternating N-type and P-type semiconductor regions 704 and 706 may have trenches 708 formed there between, the trenches 708 extending partially into the substrate 700. Additionally, in one embodiment, a bottom anti-reflective coating (BARC) material 710 or other protective layer (such as a layer amorphous silicon) is formed on the alternating N-type and P-type semiconductor regions 704 and 706, as is depicted in FIG. 7A.

In an embodiment, the light receiving surface 701 is a texturized light-receiving surface, as is depicted in FIG. 7A. In one embodiment, a hydroxide-based wet etchant is employed to texturize the light receiving surface 701 of the substrate 700 and, possibly, the trench 708 surfaces as is also depicted in FIG. 7A. It is to be appreciated that the timing of the texturizing of the light receiving surface may vary. For example, the texturizing may be performed before or after the formation of the thin dielectric layer 702. In an embodiment, a texturized surface may be one which has a regular or an irregular shaped surface for scattering incoming light, decreasing the amount of light reflected off of the light receiving surface 701 of the solar cell. Referring again to FIG. 7A, additional embodiments can include formation of a passivation and/or anti-reflective coating (ARC) layers (shown collectively as layer 712) on the light-receiving surface 701. It is to be appreciated that the timing of the formation of passivation and/or ARC layers may also vary.

Referring again to FIG. 7A, a plurality of metal seed material regions 714 is formed to provide a metal seed material region on each of the alternating N-type and P-type semiconductor regions 704 and 706, respectively. The metal seed material regions 714 make direct contact to the alternating N-type and P-type semiconductor regions 704 and 706. In an embodiment, the metal seed regions 714 are aluminum regions. In one such embodiment, the aluminum regions each have a thickness approximately in the range of 0.1 to 20 microns and include aluminum in an amount greater than approximately 97% and silicon in an amount approximately in the range of 0-2%. In other embodiments, the metal seed regions 714 include a metal such as, but not limited to, nickel, silver, cobalt or tungsten. Optionally, a protection layer may be included on the plurality of metal seed material regions 714. In a particular embodiment, an insulating layer 716 is formed on the plurality of metal seed material regions 714. In an embodiment, the insulating layer 716 is a silicon nitride or silicon oxynitride material layer. In another embodiment, in place of the metal seed regions 714, a blanket metal seed layer is used that is not patterned at this stage of processing. In that embodiment, the blanket metal seed layer may be patterned in a subsequent etching process, such as a hydroxide-based wet etching process.

Referring to operation 804 of flowchart 800 and again to corresponding FIG. 7A, the method of fabricating the solar cell further includes locating a metal foil above the alternating N-type and P-type semiconductor regions. In particular, a metal foil 718 is adhered to the alternating N-type and P-type semiconductor regions 704 and 706. The metal foil 718 may be located or fit-up with the substrate 700 in a manner as described in association with FIGS. 1A-1C. In an embodiment, the metal foil 718 is adhered to the alternating N-type and P-type semiconductor regions 704 and 706 by directly coupling portions of the metal foil 718 with a corresponding portion of each of the metal seed material regions 714. In one such embodiment, the direct coupling of portions of the metal foil 718 with a corresponding portion of each of the metal seed material regions 714 involves forming a metal weld 720 at each of such locations, as is depicted in FIG. 7A.

In an embodiment, the metal foil 718 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 718 is adhered directly to the plurality of metal seed material regions 714 by using a technique such as, but not limited to, a laser welding process, a thermal compression process and an ultrasonic bonding process. In an embodiment, the optional insulating layer 716 is included, and adhering the metal foil 718 to the plurality of metal seed material regions 714 involves breaking through regions of the insulating layer 716, as is depicted in FIG. 7A.

It is to be appreciated that, in accordance with another embodiment of the present disclosure, a seedless approach may be implemented. In such an approach, metal seed material regions 714 are not formed, and the metal foil 718 is adhered directly to the material of the alternating N-type and P-type semiconductor regions 704 and 706. For example, in one embodiment, the metal foil 718 is adhered directly to alternating N-type and P-type polycrystalline silicon regions. In either case, the process may be described as adhering the metal foil to a metallized surface of a solar cell.

Referring to operation 806 of flowchart 800 and again to corresponding FIG. 7A, the method of fabricating the solar cell further includes forming a mask layer on the metal foil. In particular, a mask layer 790 is formed on metal foil 718. In an embodiment, the mask layer 790 is formed on the metal foil 718 prior to locating or fitting-up the metal foil 718 with the substrate 700. In another embodiment, the mask layer 790 is formed on the metal foil 718 subsequent to locating or fitting-up the metal foil 718 with the substrate 700. In an embodiment, the mask layer 790 is a silicon nitride layer.

Referring to operation 808 of flowchart 800 and to corresponding FIG. 7B, the method of fabricating the solar cell further includes forming a plurality of indentations through the mask layer and through only a portion of the metal foil, the plurality of indentations formed at regions corresponding to locations between the alternating N-type and P-type semiconductor regions. In particular, indentations 730 are formed through the mask layer 790 and in the metal foil 718 at regions corresponding to locations between the alternating N-type and P-type semiconductor regions 704 and 706, e.g., above trench 708 locations as is depicted in FIG. 7B. In an embodiment, the indentations 730 are formed into only a portion of the metal foil 718, i.e., extending partially into, but not entirely through, the metal foil 718, as is depicted in FIG. 7B. In an embodiment, the indentations 730 are formed to a depth approximately in the range of 75-90% of an entire thickness of the metal foil 718. Conductive regions 740 with portions of the mask layer 790 remaining thereon are retained between each of the indentations 730.

In an embodiment, forming the plurality of indentations 730 through only the portion of the metal foil 718 involves rolling a roller having a cylindrical base with a plurality of raised features thereon over the metal foil (as described in association with FIGS. 2 and 3), the raised features forming the indentations 730. In one such embodiment, rolling the roller involves thermo-compression bonding the metal foil 718 to the alternating N-type and P-type semiconductor regions using pressure applied from the cylindrical base of the roller. In another embodiment, forming the plurality of indentations 730 through only the portion of the metal foil 718 involves stamping the metal foil 718 with a flat die cutter or a rotary die cutter (as described in association with FIGS. 2 and 4). In an embodiment, the plurality of indentations 730 is formed at a process temperature approximately in the range of 350-550 degrees Celsius.

Referring to operation 810 of flowchart 800 and to corresponding FIG. 7C, the method of fabricating the solar cell further includes, subsequent to forming the plurality of indentations 730, isolating regions 740 of the remaining metal foil corresponding to the alternating N-type and P-type semiconductor regions. That is, the indentations 730 of FIG. 7B are used to isolate conductive regions 740 as metallization structures for the underlying emitter regions. For example, referring to FIG. 7C, the indentations 730 are extended to provide gaps 732 between conductive regions 740. In an embodiment, the patterned metal foil 718 is etched to isolate portions 540 of the metal foil 518. In one such embodiment, the structure of FIG. 7B is exposed to a wet etchant. In an embodiment, the mask layer 790 protects the remaining metal foil portions 740 during the etching. In a particular embodiment, a hydroxide based etchant is used, such as, but not limited to, sodium hydroxide, potassium hydroxide (KOH) or tetramethylammonium hydroxide (TMAH). In an embodiment, the mask layer 790 is removed from the metal foil regions 740 subsequent to performing the etching process.

Figure 9:
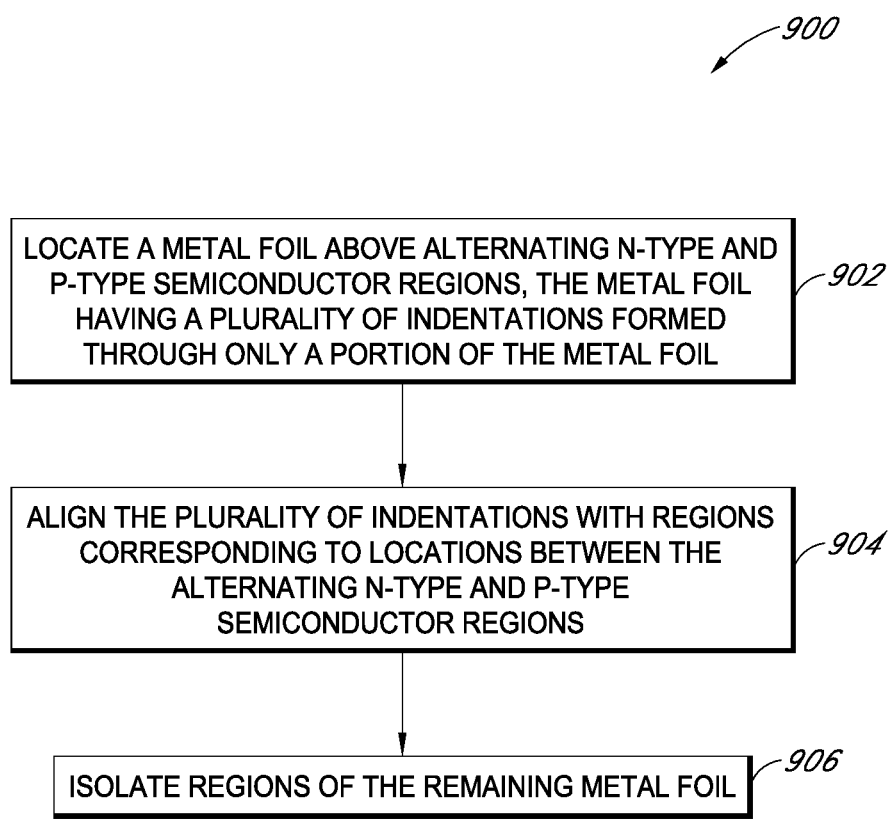
FIG. 9 is a flowchart listing operations in another method of fabricating a solar cell, in accordance with another embodiment of the present disclosure.

In a second aspect, a metal foil has indentations formed therein prior to coupling the metal foil with a solar cell. Consistent with the second aspect, FIG. 9 is a flowchart listing operations in another method of fabricating a solar cell, in accordance with another embodiment of the present disclosure.

Referring to operation 902 of flowchart 900, a method of fabricating a solar cell includes locating a metal foil above alternating N-type and P-type semiconductor regions formed in or above a substrate. The metal foil has a plurality of indentations formed through only a portion of the metal foil. In an embodiment, the plurality of indentations is formed to a depth approximately in the range of 75-90% of an entire thickness of the metal foil.

Referring to operation 904 of flowchart 900, the method of fabricating the solar cell further includes aligning the plurality of indentations with regions corresponding to locations between the alternating N-type and P-type semiconductor regions. In an embodiment, the aligning of the plurality of indentations with regions corresponding to locations between the alternating N-type and P-type semiconductor regions is performed at the same time as performing the locating the metal foil above alternating N-type and P-type semiconductor regions of operation 902. In an embodiment, locating the metal foil above the alternating N-type and P-type semiconductor regions and aligning the plurality of indentations further includes adhering the metal foil to the alternating N-type and P-type semiconductor regions using a technique such as, but not limited to, a laser welding process, a thermal compression process or an ultrasonic bonding process.

Referring to operation 906 of flowchart 900, the method of fabricating the solar cell further includes, subsequent to aligning the plurality of indentations, isolating regions of the remaining metal foil corresponding to the alternating N-type and P-type semiconductor regions. In an embodiment, isolating regions of the remaining metal foil involves etching the remaining metal foil at the locations between the alternating N-type and P-type semiconductor regions. In an embodiment, isolating regions of the remaining metal foil involves anodizing the remaining metal foil.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, indentation approaches for foil-based metallization of solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a plurality of alternating N-type and P-type semiconductor regions in or above a substrate;
    locating a metal foil above the alternating N-type and P-type semiconductor regions;
    forming a plurality of continuous indentations through only a portion of the metal foil, the plurality of indentations formed between and in a direction parallel with the alternating N-type and P-type semiconductor regions;
    during the forming the plurality of continuous indentations, forming a continuous compression bond to bond the metal foil to the alternating N-type and P-type semiconductor regions, wherein forming the plurality of continuous indentations and the continuous compression bond is performed using raised features and a cylindrical base of a roller; and
    subsequent to forming the plurality of indentations, isolating regions of remaining metal foil corresponding to the alternating N-type and P-type semiconductor regions.

2. The method of claim 1, wherein forming the plurality of indentations comprises forming the plurality of indentations to a depth approximately in the range of 75-90% of an entire thickness of the metal foil.

3. The method of claim 1, wherein forming the plurality of indentations comprises forming the plurality of indentations at a process temperature approximately in the range of 350-550 degrees Celsius.

4. The method of claim 1, wherein isolating regions of remaining metal foil comprises etching the remaining metal foil at the locations between the alternating N-type and P-type semiconductor regions.

5. The method of claim 1, wherein isolating regions of remaining metal foil comprises anodizing the remaining metal foil.

6. The method of claim 1, wherein locating the metal foil above the alternating N-type and P-type semiconductor regions further comprises adhering the metal foil to the alternating N-type and P-type semiconductor regions using a technique selected from the group consisting of a laser welding process, a thermal compression process and an ultrasonic bonding process.

7. The method of claim 1, wherein forming the plurality of alternating N-type and P-type semiconductor regions comprises forming the alternating N-type and P-type semiconductor regions in a polycrystalline silicon layer formed above the substrate, the method further comprising:
    forming a trench between each of the alternating N-type and P-type semiconductor regions, the trenches extending partially into the substrate.

8. The method of claim 1, wherein the substrate is a monocrystalline silicon substrate, and wherein forming the plurality of alternating N-type and P-type semiconductor regions comprises forming the alternating N-type and P-type semiconductor regions in the monocrystalline silicon substrate.

9. A solar cell fabricated according to the method of claim 1.

10. A method of fabricating a solar cell, the method comprising:
    forming a plurality of alternating N-type and P-type semiconductor regions in or above a substrate;
    locating a metal foil above the alternating N-type and P-type semiconductor regions;
    forming a plurality of continuous indentations through only a portion of the metal foil, the plurality of indentations formed between and in a direction parallel with the alternating N-type and P-type semiconductor regions, wherein forming the plurality of indentations comprises forming the plurality of indentations to a depth approximately in the range of 75-90% of an entire thickness of the metal foil, and
    wherein forming the plurality of indentations comprises forming the plurality of indentations at a process temperature approximately in the range of 350-550 degrees Celsius;
    during the forming the plurality of continuous indentations, forming a continuous compression bond to bond the metal foil to the alternating N-type and P-type semiconductor regions, wherein forming the plurality of continuous indentations and the continuous compression bond is performed using raised features and a cylindrical base of a roller; and
    subsequent to forming the plurality of indentations, isolating regions of remaining metal foil corresponding to the alternating N-type and P-type semiconductor regions.

11. The method of claim 10, wherein isolating regions of remaining metal foil comprises etching the remaining metal foil at the locations between the alternating N-type and P-type semiconductor regions.

12. The method of claim 10, wherein isolating regions of remaining metal foil comprises anodizing the remaining metal foil.

13. The method of claim 10, wherein locating the metal foil above the alternating N-type and P-type semiconductor regions further comprises adhering the metal foil to the alternating N-type and P-type semiconductor regions using a technique selected from the group consisting of a laser welding process, a thermal compression process and an ultrasonic bonding process.

14. The method of claim 10, wherein forming the plurality of alternating N-type and P-type semiconductor regions comprises forming the alternating N-type and P-type semiconductor regions in a polycrystalline silicon layer formed above the substrate, the method further comprising:
    forming a trench between each of the alternating N-type and P-type semiconductor regions, the trenches extending partially into the substrate.

15. The method of claim 10, wherein the substrate is a monocrystalline silicon substrate, and wherein forming the plurality of alternating N-type and P-type semiconductor regions comprises forming the alternating N-type and P-type semiconductor regions in the monocrystalline silicon substrate.

16. A solar cell fabricated according to the method of claim 13.

17. A method of fabricating a solar cell, the method comprising:
    forming a plurality of alternating N-type and P-type semiconductor regions in or above a substrate;
    locating a metal foil above the alternating N-type and P-type semiconductor regions, wherein locating the metal foil above the alternating N-type and P-type semiconductor regions further comprises adhering the metal foil to the alternating N-type and P-type semiconductor regions using a technique selected from the group consisting of a laser welding process, a thermal compression process and an ultrasonic bonding process;

forming a plurality of continuous indentations through only a portion of the metal foil, the plurality of indentations formed between and in a direction parallel with the alternating N-type and P-type semiconductor regions;

during the forming the plurality of continuous indentations, forming a continuous compression bond to bond the metal foil to the alternating N-type and P-type semiconductor regions, wherein forming the plurality of continuous indentations and the continuous compression bond is performed using raised features and a cylindrical base of a roller; and subsequent to forming the plurality of indentations, isolating regions of remaining metal foil corresponding to the alternating N-type and P-type semiconductor regions, wherein isolating regions of remaining metal foil comprises etching the remaining metal foil at the locations between the alternating N-type and P-type semiconductor regions.

18. The method of claim 17, wherein forming the plurality of alternating N-type and P-type semiconductor regions comprises forming the alternating N-type and P-type semiconductor regions in a polycrystalline silicon layer formed above the substrate, the method further comprising:

forming a trench between each of the alternating N-type and P-type semiconductor regions, the trenches extending partially into the substrate.

19. The method of claim 17, wherein the substrate is a monocrystalline silicon substrate, and wherein forming the plurality of alternating N-type and P-type semiconductor regions comprises forming the alternating N-type and P-type semiconductor regions in the monocrystalline silicon substrate.

20. A solar cell fabricated according to the method of claim 17.

* * * * *